United States Patent
Schmidtlein

(10) Patent No.: US 8,749,940 B2
(45) Date of Patent: Jun. 10, 2014

(54) ELECTRONIC COMPONENT

(75) Inventor: Andreas Schmidtlein, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/503,983

(22) PCT Filed: Sep. 9, 2010

(86) PCT No.: PCT/EP2010/063231
§ 371 (c)(1),
(2), (4) Date: Jul. 9, 2012

(87) PCT Pub. No.: WO2011/054565
PCT Pub. Date: May 12, 2011

(65) Prior Publication Data
US 2012/0268854 A1    Oct. 25, 2012

(30) Foreign Application Priority Data

Nov. 6, 2009 (DE) .......................... 10 2009 046 446

(51) Int. Cl.
*H02H 5/04* (2006.01)
(52) U.S. Cl.
USPC ....................................................... 361/103
(58) Field of Classification Search
USPC ....................................................... 361/103
See application file for complete search history.

(56) References Cited

U.S. PATENT DOCUMENTS

| | | | |
|---|---|---|---|
| 4,486,804 A | | 12/1984 | Watson et al. |
| 5,612,662 A | * | 3/1997 | Drekmeier et al. ........... 337/389 |
| 5,770,993 A | * | 6/1998 | Miyazawa et al. ........... 337/160 |
| 7,911,314 B2 | * | 3/2011 | Dauth et al. .................. 337/407 |
| 2001/0026430 A1 | * | 10/2001 | Onizuka et al. ............... 361/103 |
| 2004/0141292 A1 | * | 7/2004 | Onizuka et al. ............... 361/704 |

FOREIGN PATENT DOCUMENTS

| | | |
|---|---|---|
| DE | 32 05 662 | 8/1983 |
| DE | 39 30 819 | 3/1991 |
| DE | 93 19 287 | 2/1994 |
| DE | 196 39 427 | 3/1997 |
| DE | 197 52 781 | 6/1999 |
| DE | 10 2005 005 549 | 8/2006 |
| EP | 0 352 771 | 1/1990 |
| JP | 9-306319 | 11/1997 |
| JP | 2006059568 | 3/2006 |
| WO | WO2009130946 | 10/2009 |

OTHER PUBLICATIONS

International Search Report for PCT/EP2010/063231. dated Dec. 14, 2010.

* cited by examiner

*Primary Examiner* — Dharti Patel
(74) *Attorney, Agent, or Firm* — Kenyon & Kenyon LLP

(57) ABSTRACT

An electronic component has an integrated protective device which responds in the event of a thermal overload and interrupts a current flow through the component. The protective device has an electrical terminal which may be brought under spring pretension by intrinsic resilience and assumes a mounting position in the pretensioned state and a current interrupting position in the untensioned state.

5 Claims, 2 Drawing Sheets

ELECTRONIC COMPONENT

BACKGROUND OF THE INVENTION

1. Field of the Invention

The present invention relates to an electronic component having an integrated protective device which responds in the event of a thermal overload and interrupts a current flow through the component.

2. Description of Related Art

Electronic components of this type are known from the related art. The component is always designed in such a way that it may be operated within a certain temperature range without becoming damaged. The component may heat up due to an electric current which flows through the component or due to another external effect. If the component heats to a temperature above a certain temperature value it may become damaged. This state is referred to as thermal overload. In the event of a thermal overload of this type, a protective device of the component should interrupt the current flow through the component. For example, published German patent application document DE 197 52 781 A1 describes a circuit arrangement for protecting an electrical part in which a protective device is provided. The component which has the protective device includes two external electrical contact points via which the component is electrically connectable to the outside. In a first state, the component is formed in such a way that the two contact points are each electrically connectable in such a way that the current is able to flow through the component. As a result of an inner or outer heat effect, the component housing undergoes mechanical deformation due to a multilayer structure having different coefficients of thermal expansion and assumes a second state in which at least one contact point is not electrically connectable so that no current is able to flow through the component. The protective device operates directly on the basis of the heat effect.

BRIEF SUMMARY OF THE INVENTION

The electronic component of the present invention has the advantage that, in the event of a thermal overload, the current flow through the component is interrupted as a result of a spring pretension without the necessity of mechanical deformation by heating the component. This is achieved according to the present invention by the fact that the protective device has an electrical terminal which may be brought under spring pretension by intrinsic resilience and assumes a mounting position in the pretensioned state and a current interrupting position in the untensioned state. An electronic component is understood to be an electrical part in electrical engineering, for example a diode, a transistor, a resistor or a capacitor. It may thus be a passive component which does not demonstrate an amplifying effect and has no control function. Such components are also understood to be active components which have an amplifying effect and/or a control function. In this context, an electronic component is expressly not understood to be a purely electrical connection between two contacts, for example a wire lead or an electrical fuse. In the component according to the present invention, the electrical terminal is characterized by intrinsic resilience. This means that the electrical terminal is made of a resilient material, at least in areas, and is elastically deformable. This makes it possible to pretension the terminal and hold it in the pretensioned state. After the tension is relieved, the terminal returns to its original form. This is referred to as the untensioned state. In the pretensioned state, the terminal is in the so-called mounting position. This is the position in which a current is able to flow through the mounted terminal. The electrical terminal is designed in such a way that it assumes a current interrupting position in the untensioned state. In this position, therefore, no current should be able to flow through the electrical terminal. Both states may be implemented due to the fact that the terminal may be brought under spring pretension, i.e., it may be pretensioned.

One refinement of the present invention provides that the terminal is an externally electrically connectable connecting element of the component or an internal connecting element of the component which is, in particular, inaccessible from the outside. It is also possible to design the terminal as an externally electrically connectable connecting element, for example a connecting pin. This connecting pin is used to electrically connect the component to the outside. However, the terminal may likewise be an internal connecting element which is used for connection within the component. In particular, it may be inaccessible from the outside. This may preferably be achieved by the fact that the component has a housing which fully surrounds the terminal. However, the ability of the terminal to assume the current interrupting position must always be ensured.

One refinement of the present invention provides that the terminal which is designed as an internal connecting element and assumes the mounting position is connected to an electrical mating terminal of the component with the aid of a thermally detachable, electrical connection. It may thus be provided that the component has an electrical mating terminal to which the terminal is connected. Due to the fact that the terminal is in the mounting position and is thus pretensioned and is connected to the electrical mating connection with the aid of a thermally detachable, electrical connection, the terminal protects the component in the event of a thermal overload. For this purpose, the thermally detachable, electrical connection must be designed in such a way that it no longer fixedly connects the terminal and the mating terminal in the event of a thermal overload. After the connection is released, the electrical terminal, which until that point has been in the mounting position, now assumes the untensioned state, i.e., the current interrupting position, due to its intrinsic resiliency. This ensures that no current is able to flow between the terminal and the mating terminal.

One refinement of the present invention provides that the connection is a soft solder joint. A soft solder joint is a thermally detachable, electrical connection which may be detached by heating to a specific temperature. This temperature is dependent on the solder used. The solder may be selected in such a way that it is and remains solid within the temperature range in which the component is not thermally overloaded, thus establishing a fixed connection. In the range of thermal overload, on the other hand, the solder melts, which releases the connection.

One refinement of the present invention provides that the terminal is elastically bent at least in areas for the purpose of assuming its pretensioned state. By elastically bending the terminal, the latter may be transitioned from the untensioned state to the pretensioned state. The bending action represents a change in the shape of the terminal, which places the terminal in the pretensioned state under spring pretension.

One refinement of the present invention provides that a removable fixing device, which holds the terminal in the mounting position, is attached to the component. To maintain the terminal in the mounting position, it is necessary to continuously apply a force to the terminal or to fix the terminal in place. The terminal would otherwise transition to the untensioned state, due to the intrinsic resilience. For this purpose, it is sufficient, in principle, for the fixing device to apply a force to the terminal in only one area of the terminal and thereby hold the latter in the mounting position. The fixing device and/or the terminal is/are preferably designed in such a way that the fixing device is held on the terminal as a result of the spring pretension.

One refinement of the present invention provides that the terminal has an elastic, U-shaped area which is gripped or straddled by the fixing device in the mounting position. If the terminal has an elastic, U-shaped area, it is possible for the terminal to assume the shape of a farther opened U, i.e., rather a V, or a farther closed U in an untensioned state, due to the intrinsic resilience. If the exact U shape of the terminal corresponds to the mounting position, the fixing device must surround or straddle the U-shaped area to hold the terminal in this position.

The present invention furthermore relates to an electrical circuit arrangement which includes an electronic component having the features according to the aforementioned embodiments and having a circuit substrate which includes at least one electrical contact point. The circuit arrangement is characterized by the fact that the component terminal, which is in the mounting position, is connected to the contact point with the aid of a thermally detachable electrical connection, and at least one area of the component which does not belong to the terminal is affixed to the circuit substrate. Affixing the component which includes the terminal and a further area of the component not belonging to the terminal to the circuit substrate ensures that a further area of the component is connected to the circuit substrate even if the connection is detached from the terminal and contact point. It is not important for this fixing means to be thermally detachable and/or electrically conductive. This fixing means could thus be a form-locked or force-fit fixing means between the circuit substrate and the component. The component which is connected to the circuit substrate in this way is thus fixedly connected to the circuit substrate. In the event of a thermal overload of the electronic component, the thermally detachable connection between the terminal and the contact point is released as a result of the heating of the component and the heating of the connection associated with this. The terminal is thus no longer fixed in the mounting position, is untensioned due to the spring pretension and assumes the current interrupting position so that the connection is electrically and mechanically separated. A current can therefore no longer flow between the contact point and the terminal.

One refinement of the present invention provides that the terminal rests on the contact point. For example, a contact between an underside of the terminal and an upper side of the contact point ensures that the terminal is able to assume the current interrupting position in the untensioned state without a physical blockage being provided, for example by the contact point. It is therefore also preferred that the electronic component be an SMD, i.e., a surface-mountable device.

One refinement of the present invention provides that the connection is a soft solder joint. A soft solder joint is a typical, favorable and easily implemented connection which is thermally detachable and electrically conductive. In addition, a fluid soft solder solidifies very quickly, which rapidly produces the fixed connection. A connection of this type is also suitable for a circuit arrangement manufactured by a robotic system.

One refinement of the present invention provides that the connection is an electrically conductive adhesive bond. In particular, a connection over a large surface area is comparatively easy to manufacture as an adhesive bond. In addition, an adhesive connection has a certain elasticity, which effectively compensates for a mechanical load on the connection.

The present invention furthermore relates to a method for assembling an electronic component on a circuit substrate, in particular according to the aforementioned embodiments, an electrical terminal of the electronic component being electrically connected to a contact point of the circuit substrate. The method is characterized by the fact that the component terminal is brought into the mounting position and held in this position with the aid of a removable fixing device, the terminal is connected to the contact point with the aid of a thermally detachable, electrical connection, the fixing device is removed after the connection solidifies, and an area of the component which does not belong to the terminal is affixed to the circuit substrate before or after the terminal is brought into the mounting position or before or after the connection is established. The component terminal is initially brought from its untensioned state to a pretensioned state, the mounting position. To maintain this position, a removable fixing device is situated on the component. Before or after these operations, the component is situated on the circuit substrate in such a way that, in the mounting position, the terminal rests against the contact point or is situated directly thereover. The terminal must be situated close to the contact point in such a way that the two may be fixedly connected with the aid of the thermally detachable electrical connection. Following this connecting action and after the connection has solidified or has become rigid, the fixing device is removed. In addition, an area of the component which does not belong to the terminal is affixed to the circuit substrate. This may be done before or after the terminal has been brought into the mounting position or before or after the connection has been established. Care must only be taken that the terminal is in the mounting position before the two parts, the terminal and the component, are fixed in place. Only in the mounting position is the terminal able to respond to thermal overload, namely as a protective device, and to interrupt the current flow through the component.

DETAILED DESCRIPTION OF THE INVENTION

Figure 1:
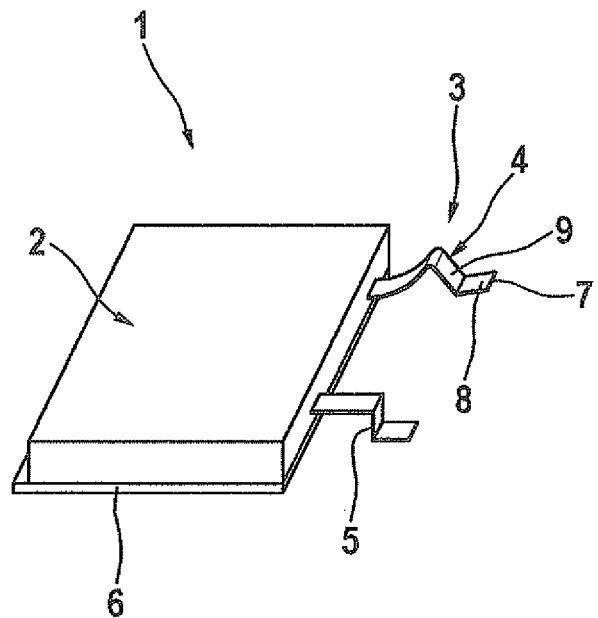
FIG. 1 shows a perspective view of an electronic component.

FIG. 1 shows a perspective view of an electronic component 1, in this case a surface-mountable metal oxide semiconductor field effect transistor (MOSFET), by way of example. This component has a housing 2, an electrical terminal 4 designed as a protective device 3, a first contact 5 and a second contact 6. Terminal 4 is in an untensioned state by way of example, i.e., in the current interrupting position. Terminal 4, which is made of a resilient material, at least in areas, may be brought under spring pretension due to its intrinsic resilience. This is possible, on the one hand, by placing terminal 4 in such a position in which the shape of terminal 4 largely matches the shape of first contact 5. Terminal 4 does not maintain this position, due to its intrinsic resilience. It always assumes the shape illustrated in FIG. 1, i.e., the untensioned state, if no force is acting upon terminal 4. On the other hand, it is possible to move terminal 4 from the illustrated untensioned state farther to the left and upward, which also corresponds to a pretensioned state. A pretensioned position of this type is also not maintained, due to the intrinsic resilience.

Terminal 4 in this case is an externally electrically connectable connecting element of component 1. It is used to connect component 1 to other components, which are not illustrated here. First contact 5 and second contact 6 are also externally electrically connectable connecting elements. By way of example, terminal 4 in this case is a source contact of the MOSFET, first contact 5 is a gate contact and second contact 6 is a drain contact. Terminal 4 has a contacting section 8 on one front end 7. A conducting section 9 of electrical terminal 4 adjoins this contacting section in the direction of housing 2 of component 1. Contacting section 8 is used to enable terminal 4 to be connected to other components with the aid of a connection. In this exemplary embodiment, conducting section 9 has elastic properties and a bent shape. Entire terminal 4 is made of a conductive material. Terminal 4 is thus simultaneously an externally connectable connecting element and protective device 3.

Figure 2:
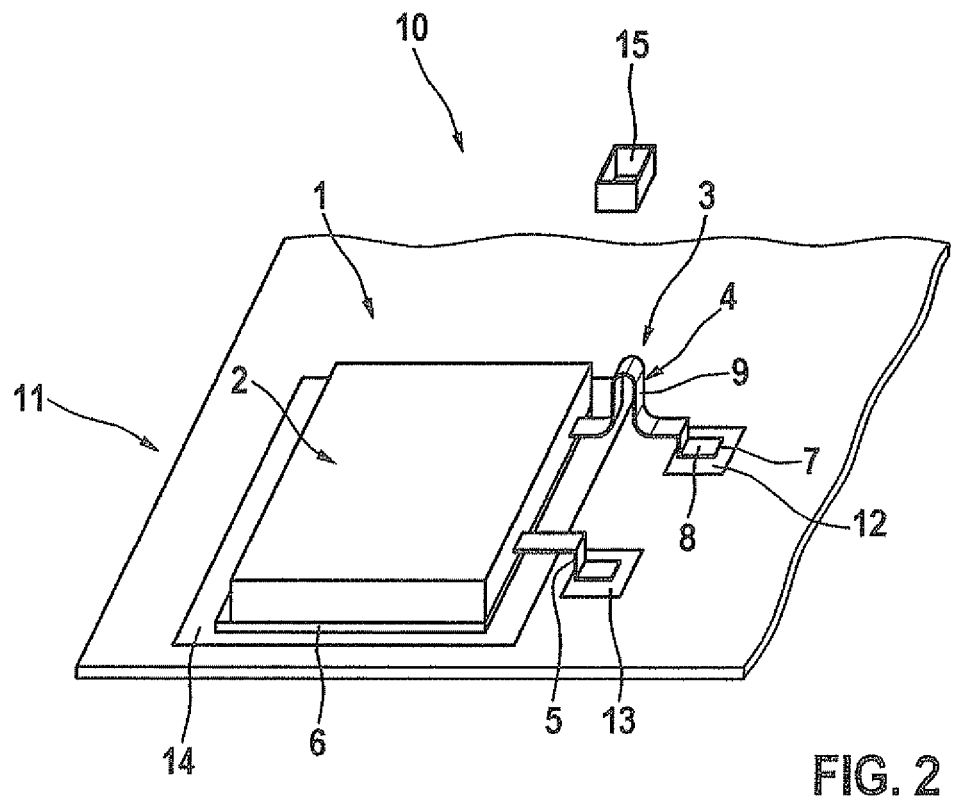
FIG. 2 shows a perspective view of an electrical circuit arrangement including the electronic component and a circuit substrate.

FIG. 2 shows an electrical circuit arrangement 10 which includes an electronic component 1 which is situated on a circuit substrate 11. Equivalent and functionally equivalent parts are provided with the same reference numerals, so that reference is thus made to the description of FIG. 1.

Circuit substrate 11 has an electrical contact point 12, a first solder pad 13 and a second solder pad 14.

In addition, FIG. 2 shows a fixing device 15 in a state in which it does not interact with component 1. Terminal 4 is shown as having a U shape in the pretensioned state, i.e., in the mounting position. It would be possible, for example, for conducting section 9 to run in a straight line like first contact 5 in the untensioned state or—as illustrated in FIG. 1—to largely have the shape of a farther opened U. To maintain the mounting position, it is necessary that a force acts upon terminal 4 so that the terminal does not assume the untensioned state due to the intrinsic resilience. A force of this type may be applied, for example, by placing fixing device 15 on terminal 4. Terminal 4 in this case is illustrated in such a way that it is designed to have a largely U shape in the area of conducting section 9. If terminal 4 assumes the shape of a farther opened U, or rather a V, in the untensioned state, fixing device 15 illustrated here, which has a square recess, is suitable for holding terminal 4 in the pretensioned state. For this purpose, fixing device 15 must be placed over conducting section 9 of terminal 4, which is bent in the shape of a U. It is also conceivable for fixing device 15 to apply a force to terminal 4 only at one point, so that the terminal is held in the mounting position. In addition, fixing device 15 must be removable or detachable only to the extent that it does not prevent terminal 4 from assuming the untensioned state, i.e., the current interrupting position, after mounting, so that the protective action of protective device 3 is not impaired. It is therefore possible to design fixing device 15 in such a way that it is fixedly connected to an area of component 1. It is thus only necessary for it to be able to assume both a position which fixes terminal 4 in place and a position which does not fix it in place.

Contacting section 8 of terminal 4 touches electrical contact point 12 of circuit substrate 11. Due to the contact between contacting section 8 and contact point 12, a current is able to flow between the two. However, no connection exists for fixing the illustrated position.

First contact 5 rests upon first solder pad 13 and second contact 6 rests upon second solder pad 14. In this case, a current may also flow as a result of the contact between contacts 5 and 6, respectively, and solder pads 13 and 14. However, a fixing connection does not exist.

Figure 3:
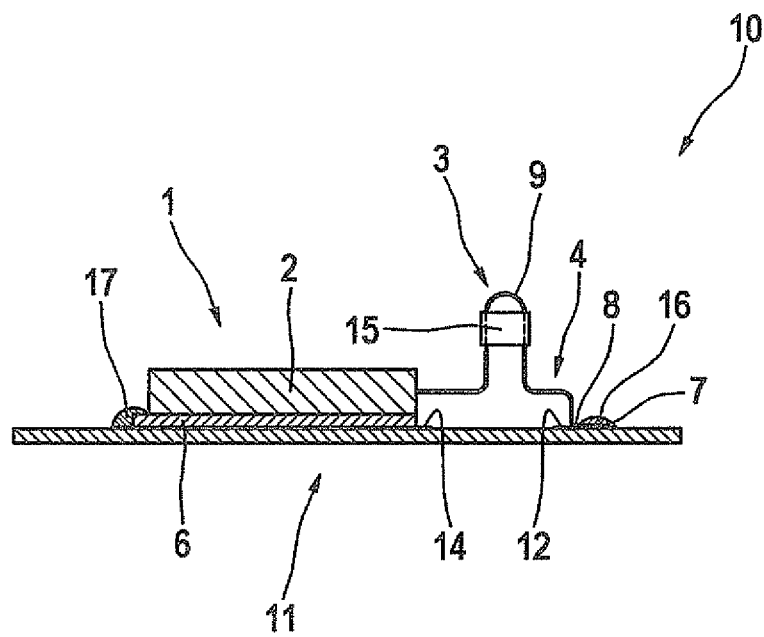
FIG. 3 shows a cross section of an electrical circuit arrangement including the electronic component and a circuit substrate.

FIG. 3 shows a cross section of an electrical circuit arrangement 10 including electronic component 1 and a circuit substrate 11. Equivalent and functionally equivalent parts are provided with the same reference numerals. Reference is thus made to the preceding description.

In the exemplary embodiment illustrated in FIG. 3, electronic component 1 is situated on circuit substrate 11. Fixing device 15 is placed on conducting section 9 of terminal 4 in such a way or encompasses it in such a way that it holds terminal 4 in the mounting position.

Contacting section 8 rests on electrical contact point 12 and is additionally connected thereto via a thermally detachable, electrically conductive connection 16. This connection 16 may be, for example, a soft solder joint or also a thermally detachable, electrically conductive adhesive connection.

In the exemplary embodiment illustrated here, a further area of component 1, which does not belong to terminal 4, is affixed to circuit substrate 11. Second contact 6 is namely connected to second solder pad 14 in this location with the aid of a fixing means 17. In the exemplary embodiment illustrated here, it is practical if fixing means 17 is an electrically conductive connection because a current should be able to flow between second contact 6, which is the drain contact of component 1, and second solder pad 14. However, it is not essential to the present invention for fixing means 17 to be an electrically conductive connection between component 1 and circuit substrate 11. It would therefore also be possible for a non-conductive area of component 1 to be connected to circuit substrate 11. This could be implemented, for example, by a form-locked connection or also by a non-conductive adhesive bond. A relative movement between component 1 and circuit substrate 11 is ruled out by the area of component 1 which does not belong to terminal 4 and which is affixed to circuit substrate 11. Component 1 is thus unable to lose the connection to circuit substrate 11, which could result in uncontrolled short circuits in other areas of circuit substrate 11 or in the area surrounding component 1.

Moreover, the additional fixing 17 of component 1 to circuit substrate 11 is used to prevent mounted terminal 4 from assuming the current interrupting position. This would be possible namely due to a relative movement between circuit substrate 11 and component 1 if no additional fixing means 17 were provided. The energy for this relative movement could come from the spring pretension of terminal 4 without fixing means 17. In this case, terminal 4 would still be permanently connected to contact point 12 but in an untensioned state and not in a pretensioned state. Protective device 3 would thus be ineffective.

Multiple advantages arise due to the use of a component 1 having an integrated protective device 3 in an electrical circuit arrangement 10: No additional thermal fuses must be provided which protect component 1 against thermal overload. Due to the fact that protective device 3 is integrated directly into component 1 to be protected, no additional spatial separation exists between component 1 and protective device 3. Due to the spatial arrangement, the response limit of integrated protective device 3 is easier to configure than a response limit of an additional thermal fuse, where the distance from the component to be protected must always be taken into account. False tripping due to spatial separation is thus simultaneously avoided.

A smaller circuit substrate 11 may furthermore be used for circuit arrangement 10 because the use of an individual component 1 having an integrated protective device 3 occupies less space than a component 1 and an additional thermal fuse. Protective device 3 of component 1 is not only used to protect component 1 against thermal overload due to a current flowing through component 1. It is furthermore also possible to interrupt the current flow through component 1 if an external thermal overload is present.

The functionality of electronic component 1 is discussed below: If, in the exemplary embodiment illustrated in FIG. 3, fixing device 15 is removed from terminal 4, component 1 remains in the pretensioned state. This position is maintained by the fact that component 1 is connected to circuit substrate 11 on contacting section 8, on the one hand, and on a further area, on the other hand, which does not belong to terminal 4, in this case second contact 6, by way of example. Due to the fact that contacting section 8 is connected to contact point 12 of circuit substrate 11, an electric current is able to flow between contact point 12 and terminal 4.

If critical heating of component 1 now occurs—due to a critical current which flows through component 1 or due to another critical external influence—it is possible that connection 16 illustrated here, for example a soft solder joint, melts due to the heat effect. The fluid solder is not a fixed connection 16 between terminal 4 and contact point 12. Since component 1 is designed as a surface-mountable component, terminal 4 is affixed to circuit substrate 11 only with the aid of connection 16. In addition, no attachment exists which limits deformation of terminal 4. Due to the fact that terminal 4 is under spring pretension in the area of conducting section 9, and the fluid solder between contacting section 8 and contact point 12 is not a fixed connection, the previously pretensioned area is untensioned and terminal 4 assumes the current interrupting position. The current flow through component 1 is thus interrupted. To do this, it is necessary for fixing means 17 to prevent a relative movement from occurring between component 1 and circuit substrate 11. For this purpose, it may be provided that fixing means 17 is not thermally detachable, or that if fixing means 17 is thermally detachable, greater heating is required to detach fixing means 17 than in the case of connection 16. Due to the existing fixing means 17 of component 1 on circuit substrate 11, there is also no risk that component 1 will come into contact with additional components which may be situated in the surroundings of component 1. This prevents a short circuit from being triggered.

What is claimed is:

1. An electrical circuit arrangement, comprising:
   an electronic component which includes a housing and an integrated protective device which responds in the event of a thermal overload and which interrupts a current flow through the electronic component, wherein the protective device has an electrical terminal which is configured to be selectively brought under spring pretension by intrinsic resilience and assumes a mounting position in the pretensioned state and assumes a current interrupting position in the untensioned state; and
   a circuit substrate which includes at least one electrical contact point;
   wherein a first end of the electrical terminal of the protective device is connected to a first area of the housing, and wherein a second end of the electrical terminal of the protective device, in the mounting position, is connected to the electrical contact point with the aid of a thermally detachable electrical connection, and wherein a second area of the housing is fixedly attached to the circuit substrate and is not thermally detachable from the circuit substrate.

2. The circuit arrangement as recited in claim 1, wherein the electrical terminal rests on the electrical contact point.

3. The circuit arrangement as recited in claim 2, wherein the thermally detachable electrical connection is a soft solder connection.

4. The circuit arrangement as recited in claim 2, wherein the thermally detachable electrical connection is an electrically conductive adhesive bond.

5. A method for assembling an electronic component on a circuit substrate, comprising:
   providing an electronic component which includes a housing and an integrated protective device which responds in the event of a thermal overload and which interrupts a current flow through the electronic component, wherein the protective device has an electrical terminal which is configured to be selectively brought under spring pretension by intrinsic resilience and assumes a mounting position in the pretensioned state and assumes a current interrupting position in the untensioned state, wherein a first end of the electrical terminal of the protective device is connected to a first area of the housing; and
   providing an electrical connection between the electrical terminal of the electronic component and a contact point of the circuit substrate, wherein the electrical terminal of electrical the component is brought into the mounting position and held in the mounting position with the aid of a removable fixing device, and wherein a second end of the electrical terminal is connected to the electrical contact point with the aid of a thermally detachable electrical connection, the removable fixing device being removed after the electrical connection solidifies, and wherein a second area of the housing is fixedly attached to the circuit substrate and is not thermally detachable from the circuit substrate.

* * * * *